United States Patent [19]

Eng et al.

[11] Patent Number: 5,172,371
[45] Date of Patent: Dec. 15, 1992

[54] GROWABLE SWITCH

[75] Inventors: Kai Y. Eng, Eatontown; Mark J. Karol, Fair Haven, both of N.J.

[73] Assignee: AT&T Bell Laboratories, Murray Hill, N.J.

[21] Appl. No.: 730,588

[22] Filed: Jul. 15, 1991

Related U.S. Application Data

[63] Continuation of Ser. No. 565,008, Aug. 9, 1990, abandoned.

[51] Int. Cl.[5] ............................................. H04L 12/56
[52] U.S. Cl. ...................................... 370/60; 370/94.1
[58] Field of Search ................. 370/60, 94.1, 16, 85.5

[56] References Cited

U.S. PATENT DOCUMENTS

| | | | |
|---|---|---|---|
| 4,516,238 | 5/1985 | Huang et al. | 370/60 |
| 4,542,497 | 9/1985 | Huang et al. | 370/60 |
| 4,621,359 | 11/1986 | McMillen | 370/60 |
| 4,623,996 | 11/1986 | McMillen | 370/60 |
| 4,893,304 | 1/1990 | Giacopelli et al. | 370/94.1 |
| 4,899,334 | 2/1990 | Shimizu | 370/60 |
| 4,899,335 | 2/1990 | Johnson, Jr. et al. | 370/60 |
| 4,955,016 | 9/1990 | Eng et al. | 370/60 |
| 4,955,017 | 9/1990 | Eng et al. | 370/60 |

OTHER PUBLICATIONS

"Sunshine: A High Performance Self-Rotating Broadband Packet Switch Architecture" by J. N. Giacopelli et al. from the XII International Switching Symposium which was held in Stockholm, Sweden on Tuesday, May 29, 1990, vol. III, p. 123.

*Primary Examiner*—Douglas W. Olms
*Assistant Examiner*—Dang T. Ton
*Attorney, Agent, or Firm*—T. Stafford

[57] ABSTRACT

A modular growable packet switching arrangement is constructed from a plurality of packet switches and a novel interconnect fabric. The interconnect fabric includes a plurality of cell routers, for receiving data packets and routing them to a plurality of packet switches, where each cell router includes at least one connection to each packet switch. The interconnect fabric also includes a sorting network for receiving concurrently arriving data packets, sorting the data packets based upon their addresses, and sending the sorted data packets to the inputs of the cell routers. The sorted data packets are arranged such that all data packets which must be transmitted to the same packet switch are sent to different cell routers. Then, all packets which are destined for a common packet switch may be routed there, each from a different cell router.

6 Claims, 3 Drawing Sheets

GROWABLE SWITCH

This application is a continuation of application Ser. No. 07/565,008, filed on Aug. 9, 1990, now abandoned.

TECHNICAL FIELD

This invention relates to packet switching, and more particularly, to an improved, modularly growable packet switch.

DESCRIPTION OF THE PRIOR ART

A packet switch is a device which accepts packets of data, voice, etc. at a plurality of inputs, and routes the packets to one or more outputs based upon an address in the packet. The packet switch must be designed such that simultaneous arriving input packets which are destined for the same output are not lost. Many architectures exist for accomplishing this task.

One such architecture is described in U.S. Pat. No. 4,623,996, issued to R. J. McMillen on Nov. 18th, 1986. In the McMillen arrangement, a plurality of queue selectors are employed, each of which is connected to a plurality of queues. One or more queues are associated with each output, and data packets are routed from the queue selectors to the queue associated with the appropriate output for the data packet.

The McMillen arrangement suffers from two limitations inherent in the architecture. First, if two packets destined for the same output arrive at the same queue selector, one of the packets will be delayed, even though there may be idle connections from other queue selectors to the desired output. Thus, switch capacity is wasted. Second, as the switch size becomes large, the number of queues required grows at a rapid rate, and the interconnection pattern becomes complex.

Another packet switch architecture is described in copending U.S. Pat. applications Ser. Nos. 400,183 and 400,184, now U.S. Pat. Nos. 4,955,017 and 4,955,016, respectively, both issued on Sep. 4, 1990 and assigned to the same assignee as this patent. The arrangement described therein employs a plurality of relatively small packet switches, and a large interconnect fabric for routing concurrently arriving packets to the inputs of the packet switches. The arrangement is suitable for building a larger packet switch out of smaller packet switching modules, and for allowing modular growth to arbitrary size with little added complexity. While this arrangement overcomes some of the problems inherent in building large packet switches, it introduces a new problem. Specifically, the interconnect fabric, being memoryless, must resolve contention between many packets which concurrently arrive and which must be routed to the same packet switch. Consequently, a relatively complex scheduling algorithm is required for routing the packets through the interconnect fabric.

The problem remaining in the prior art is to provide a modular packet switch which may be grown to arbitrary size and which is simple in its architecture and implementation.

SUMMARY OF THE INVENTION

The above problem is overcome and a technical advance is achieved in accordance with the invention, which relates to a modularly growable packet switch which requires no scheduling algorithm in the interconnect fabric at all. The interconnect fabric is implemented in two switching stages, the first of which is a sorting network, and the second of which is comprised of a plurality of cell routers. The sorting network includes a plurality of inputs for receiving concurrently arriving data packets, and a plurality of outputs, where the outputs are connected to various ones of the cell router inputs. A plurality of packet switches are then connected to the outputs of the cell routers, however, the packet switches are not part of the interconnect fabric. Preferably, each packet switch is connected to at least one output of each cell router, thereby allowing each cell router to route data packets to any of the packet switches.

In operation, data packets arrive concurrently in predetermined time slots at the inputs of the sorting network. The sorting network sorts the packets in a predetermined sequence based upon the packet switch to which each packet is destined. The sorted packets are then each transmitted on a separate output of the sorting network to a separate input of one of the cell routers, where the output of the sorting network on which a data packet is transmitted is uniquely determined by that data packet's position in the sorted sequence. The sequence is selected such that concurrently arriving data packets which are destined for the same output packet switch are sent to different cell routers. Since each cell router can route data packets to each packet switch, the concurrently arriving data packets which are destined for the same output packet switch may all be routed to that packet switch, each from a different cell router.

If the number of concurrently arriving data packets destined for the same packet switch exceeds the number of cell routers, then the sorting network cannot transmit each data packet destined for that packet switch to a separate cell router. In one embodiment, the excess packets may either be discarded, or may be fed back through the switch for transmission during a subsequent time slot.

DETAILED DESCRIPTION

Figure 1:
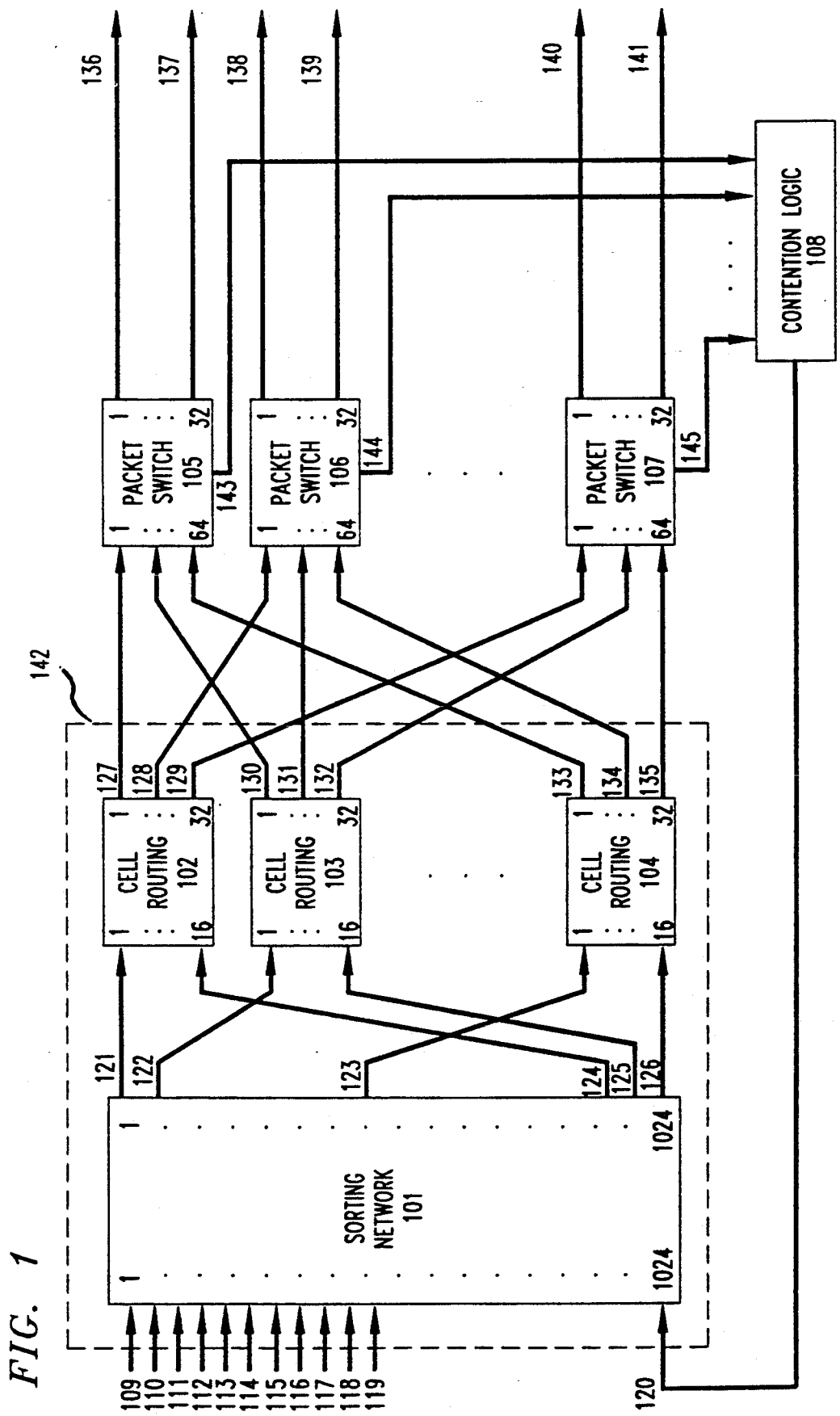
FIG. 1 shows an exemplary block diagram of a packet switching arrangement employing the novel interconnect fabric.

FIG. 1 shows an exemplary packet switching arrangement which utilizes the inventive interconnect fabric. Due to the fact that the invention is difficult to describe for small size; i.e. 16×16, arrangements, the arrangement depicted in FIG. 1 is intended to be a 1024×1024 packet switch, although all of the connections are not shown for purposes of clarity. Each of the 64 cell routers, three of which are shown, includes 16 inputs, and 32 outputs, several of which are shown. Sorting network 101 is 1024×1024 in dimension, and is labelled as such.

In general, an N×N packet switching arrangement using the invention is most advantageously constructed from an N×N sorting network, a plurality of m cell routers, each cell router including N/m inputs and N/n outputs, and a plurality of N/n packet switches, each including m inputs and n outputs, where n, m, and N are integers.

The operational concept of the packet switching arrangement of FIG. 1 can best be understood by first considering interconnect fabric 142 as a whole, without reference to the sorting network and the cell routers which it contains.

In operation, data packets arrive concurrently during predetermined time slots at inputs 109-120 of interconnect fabric 142. The function of the interconnect fabric is to route the packets to the appropriate packet switch for transmission to a destination output. For example, if packets arriving at inputs 109, 110, 111, and 115 are all destined for packet switch output 136, then interconnect fabric 142 would be required to route the four packets to packet switch 105. Note however, that there is no contention in interconnect fabric 142 among the four exemplary packets for a single output. Rather, each of the packets is routed to a separate output of interconnect fabric 142, and is thus transmitted to a separate input of packet switch 105. Packet switch 105 is then required to resolve contention among the four packets competing for the same packet switch output 136.

It is notable that as packets arrive at the interconnect fabric, the address in each packet is used to map each packet to a group of outputs, rather than to a single output. In other words, as long as the interconnect fabric routes the packet to the proper packet switch, it is irrelevant what input of that packet switch the packet is routed to. The combination of sorting network 101 and cell routers 102-104, and other cell routers not shown, provide a technique whereby each simultaneously arriving input packet which must be routed to the same packet switch is conveyed to a different input of that packet switch.

Figure 2:
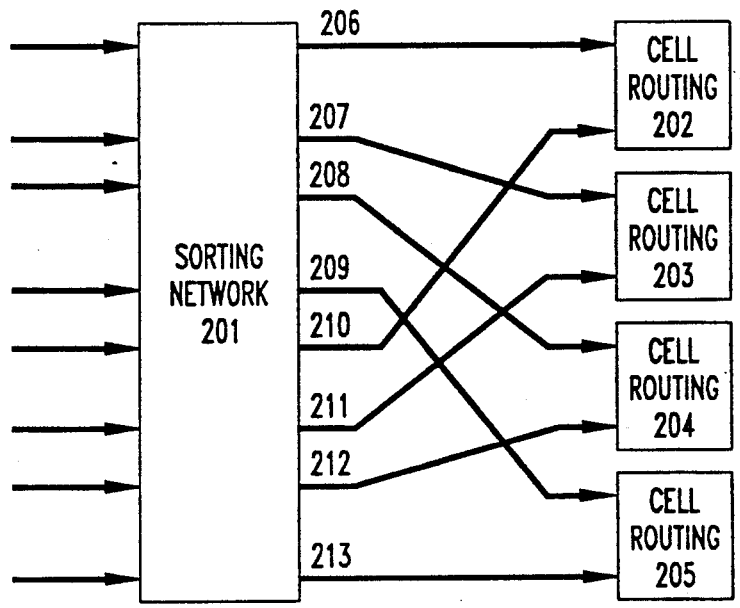
FIG. 2 is a conceptual diagram of a small interconnect fabric in accordance with the invention.

The connections 121-126 from sorting network 101 to the cell routers are chosen in a specified pattern. More particularly, the uppermost m outputs of sorting network 101 are each connected to a predetermined first input of a separate one of the cell routers. The next m outputs from sorting network 101 are each connected to a predetermined second input of the cell routers, and so forth. For the sake of understanding, FIG. 2 shows the described connection arrangement for an 8×8 sorting network 201 and four cell routers 202-205, although it can be appreciated that the connection arrangement of FIG. 2 can be easily extended to the larger switching arrangement of FIG. 1.

Returning now to FIG. 1, concurrently arriving packets in any particular time slot are sorted, based upon the packet switch to which they must be routed, by sorting network 101 into ascending order for example. Thus, if four packets arrive concurrently at interconnect fabric 142 which must be routed to packet switch 105, and three packets arrive during that same time slot which must be routed to packet switch 106, the four packets to be routed to packet switch 105 would occupy the first four positions in the sorted sequence, and the three packets to be routed to output packet switch 106 would occupy the next three positions.

Figure 3:
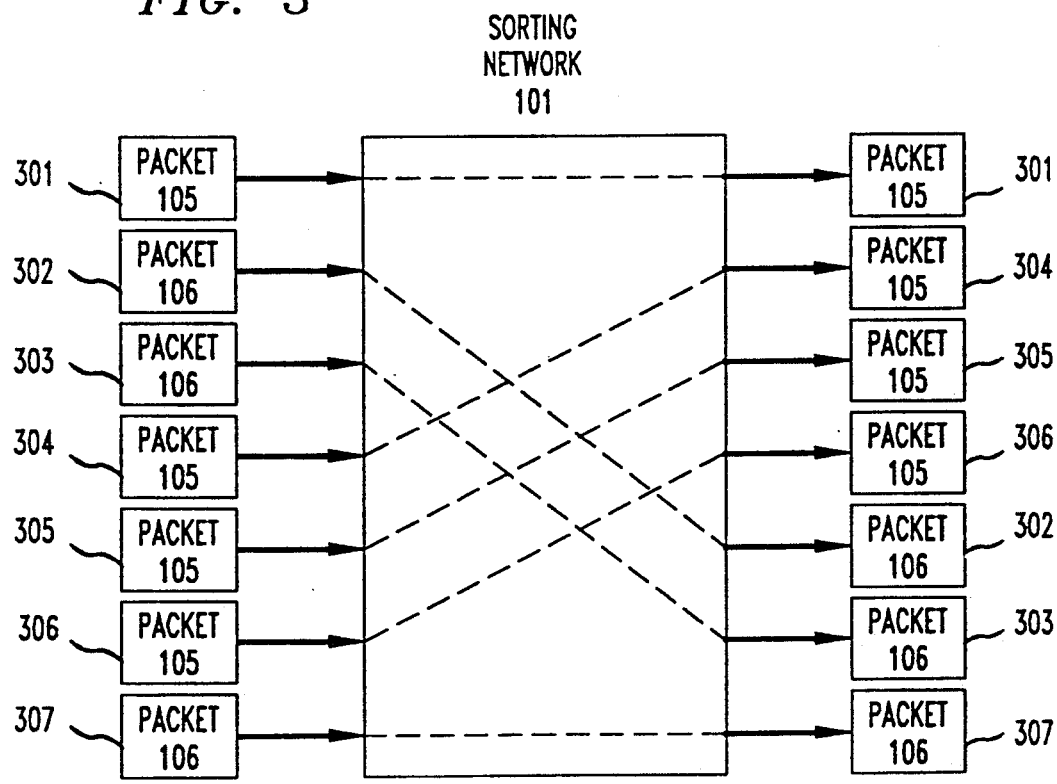
FIG. 3 is a pictorial representation of the operation of sorting network 101 of FIG. 1.

This sorting is shown pictorially in FIG. 3, intended to be representative of a small portion of sorting network 101. Each packet of FIG. 3 is labelled with the number from FIG. 1 which corresponds to the packet switch to which the packet must be routed. Additionally, adjacent to each packet there is an assigned packet number. It can be appreciated from comparing the inputs with the outputs of the portion of sorting network 101 shown in FIG. 3 that sorting network 101 arranges the packets in ascending order based upon the packet switch to which each packet must be routed, and that consequently, packets to be routed to the same packet switch are output on adjacent outputs of sorting network 101. Thus, packets 301, 304, 305, and 306 are output on adjacent outputs of sorting network 101 as shown in FIG. 3.

Returning now to FIG. 1, and conceptualizing the remaining connections which are not shown, it can be seen that any two adjacent outputs from sorting network 101; i.e. outputs 124 and 125, are connected to inputs of different cell routers. Further, as described previously, all packets destined for the same packet switch are transmitted on adjacent outputs of sorting network 101, as described previously. Thus, as long as the number of concurrently arriving packets which must be routed to the same packet switch is less than the number of cell routers, all of the packets to be routed to the same packet switch will be transmitted by sorting network 101 to different cell routers.

The cell routers each are arranged so that at least one cell output from each cell router is connected to an input from each of the packet switches. Thus, after sorting network 101 transmits all the packets for the same packet switch to different cell routers, each of the cell routers in turn will include at least one connection to the packet switch which the packets must be transmitted to. Each cell router will then route one of the packets to that packet switch.

A slightly more complicated situation arises when there are m+1 or more concurrently arriving packets which must be routed to the same packet switch, since, as described previously, there are only m cell routers. By way of example, and referring to FIG. 2, assume that there arrives 5 concurrent packets which all must be routed to the same packet switch. Since m=4 in FIG. 2, there are only 4 cell routers. After sorting network 201 sorts the packets, outputs 206-210 will each transmit a different one of the five exemplary packets, yet two of the packets will be transmitted to cell router 202; i.e. the packets from output 206 and 210. Thus, to generalize, if there are m+1 or more concurrently arriving packets for the same packet switch, the first m will each be transmitted to a different cell router, and the system will then "wrap around" back to the first cell router transmitting each of the next m or less to a separate cell router. This will result in two, and in extreme cases possible more, packets being transmitted to the same cell router which are destined for the same packet switch.

Assuming each cell router includes only one connection to each packet switch, and further, that the cell routers are bufferless, there is no way for the cell router to properly route more than one packet.

Figure 4:
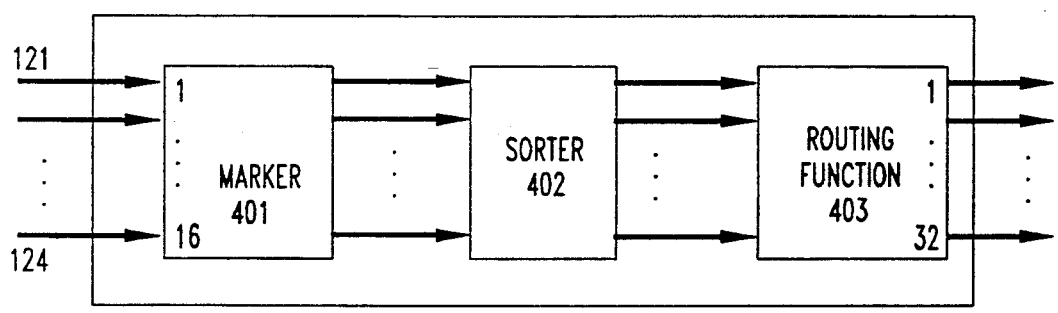
FIG. 4 shows a more detailed view of one of the exemplary cell routers of FIG. 1.

This problem may be dealt with at each of the cell routers independently. Specifically, there is shown in FIG. 4 a high level block diagram of a possible implementation of one of cell routers 102-104. The cell router includes marker 401, sorter 402, which is optional, and cell routing function 403.

In operation, a plurality of concurrently arriving packets are received at the inputs of the cell router, two of which are labelled 121-124, corresponding to two of the inputs to cell router 102 of FIG. 1. Marker 401 compares the addresses of all of the concurrently arriving data packets at cell router 102, and marks all but one of any concurrently arriving packets destined for the same packet switch. For example, if three adjacent packets are destined for packet switch 105, two of them would be marked. This marking is easily accomplished by changing a reserved bit in the address field of the packet, for example, where the resulting new address would be a dummy address greater than any real address in the system.

Assuming first the absence of optional sorter 402, the packets, after being marked, would be input directly to cell routing function 403 for distribution to their respective packet switches. Any marked packets would be transmitted on any remaining cell output, regardless of their destinations, and would thereby be sent to an incorrect packet switch. However, as FIG. 1 shows and as will be described in more detail hereafter, these packets can be recirculated and then routed to their correct cell output.

Optional sorter 402 will place the packets in ascending order based upon the output to which the packets are destined. This is optional, but suggested, since it will allow the cell routing function to be implemented using a standard, off-the-shelf Banyan arrangement, of the type well known in the art. Specifically, if the cell routers are implemented as Banyan arrangements, they will not work correctly without optional sorter 402. The sorter may be implemented using standard hardware, such as a Batcher arrangement, which is also well known in the art of packet switching. The sorter may be a smaller version of sorting network 101 of FIG. 1, which may also be implemented as a Batcher arrangement.

Returning now to FIG. 1, it can be appreciated that in any time slot, it is possible that any cell router may be forced to route one or more packets to an incorrect one of packet switches 105–107, and others not shown. In order to allow for recirculation of these misrouted packets, each packet switch is provided with a separate reserved output 143–145. Any misrouted packets are directed by the packet switch to its associated reserved output, and conveyed to contention logic 108. Contention logic 108 could be, for example, a queue, which simply stores the packets received from reserved outputs 143–145, and transmits these reserved packets, one per subsequent time slot, back to input 120 of sorting network 101. Alternatively, contention logic 108 could sequentially poll the packet switches 105–107 to determine if there are any misrouted packets to be recirculated. Each of outputs 143–145 may have a buffer associated with it, so that if more than one misrouted packet is received by the packet switch in a given time slot, both can be recirculated.

The input 120 to sorting network 101 need not be completely reserved for recirculated packets. Specifically, input 120 could be shared during alternate time slots, with a typical input, so that the packet switch need not operate with one less input. Further, more than one input may be reserved for recirculated packets, and each of these several inputs could have half of its bandwidth reserved for recirculation, and half reserved for normal packet reception. In general, as long as the average misrouted packet rate is smaller than the capacity to recirculate packets, no packets will be lost.

The probability of misrouted packets can be easily computed, and then the appropriate recirculation paths may be established. Specifically, if the outputs from the cell routers are arranged into groups of m members each then the probability of packets being discarded or recirculated, denoted P, is approximately $$P = \left[1 - \frac{m}{p}\right]\left[1 - \sum_{k=0}^{m} \frac{p^k e^{-p}}{k!}\right] + \frac{p^m e^{-p}}{m!}$$

for large N; i.e. N>256. In the above equation, p represents the loading factor for arriving packets and e is the natural logarithm base.

As an example, in a 1,000×1,000 packet switch where m=50 and n=20, the packet loss probability is less than $10^{-8}$, assuming the loading factor p is less than 0.9. The probability of packet loss can be adjusted using the above equation, which can be solved using a simple computer program, in accordance with any system requirements.

Any form of contention scheme may be implemented in contention logic 108. For example, one or more of the marked packets could be selected randomly and recirculated, or packets may include a priority field, and contention logic 108 could select the highest priority one or more packets for recirculation.

In other embodiments, the packet switches may be replaced with one or more computers, or any other type of equipment capable of accepting the packets from the cell routers.

We claim:

1. A packet routing arrangement for routing packets including destination information comprising:
   a plurality of output packet switch means each including a plurality of output ports for routing packets received thereby to said output ports;
   sorting network means supplied with concurrently arriving packets and being responsive to said destination information for grouping said concurrently arriving packets into groups based upon which output packet switch means the packets are to be supplied to and for supplying individual packets in each group to a different one of a predetermined number of cell router means except when the number of packets in a group is larger than the number of said cell router means, for groups of packets having a number of packets larger than said number of cell router means individual packets in a group remaining after packets from the group have been supplied on a one-to-one basis to said number of cell router means are supplied by said sorting network means on a one-to-one basis to ones of said number of cell router means which have at least one packet supplied to it from the group; and
   a predetermined number of said cell router means for supplying packets to said plurality of output packet switch means, each of said cell router means including means for supplying a predetermined number of packets from each of said groups to output packet switch means identified by said destination information and means for supplying any packets of a group in excess of said predetermined number of packets to output packet switch means other than the output packet switch means identified by said destination information.

2. The packet routing arrangement as defined in claim 1 wherein said predetermined number of packets is one (1).

3. The packet routing arrangement as defined in claim 1 wherein said sorting means comprises a Batcher arrangement.

4. The packet routing arrangement as defined in claim 1 wherein said cell router means comprises a Banyan arrangement.

5. The packet routing arrangement as defined in claim 2 wherein each of said cell router means includes means for marking each of said supplied packets in excess of said predetermined number and wherein each of said output packet switch means includes means for dropping each such marked packet supplied thereto.

6. The packet routing arrangement as defined in claim 2 further including means for recirculating packets to said sorting network means, wherein each of said cell router means includes means for marking each of said supplied packets in excess of said predetermined number and wherein each of said output packet switch means includes means for supplying said marked packets to said recirculating means.

* * * * *